(12) United States Patent
Mathew et al.

(10) Patent No.: US 10,642,294 B1
(45) Date of Patent: May 5, 2020

(54) VOLTAGE SELECT CIRCUIT

(71) Applicant: NXP B.V., Eindhoven (NL)

(72) Inventors: Anu Mathew, Chandler, AZ (US); Xu Zhang, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/224,932

(22) Filed: Dec. 19, 2018

(51) Int. Cl.
| | |
|---|---|
| *H03K 17/00* | (2006.01) |
| *G05F 1/56* | (2006.01) |
| *H03K 17/693* | (2006.01) |
| *G06F 1/26* | (2006.01) |
| *H03K 17/30* | (2006.01) |
| *G01R 19/165* | (2006.01) |
| *H02M 3/07* | (2006.01) |

(52) U.S. Cl.
CPC .............. *G05F 1/562* (2013.01); *G06F 1/266* (2013.01); *H03K 17/302* (2013.01); *H03K 17/693* (2013.01); *G01R 19/16528* (2013.01); *H02M 3/07* (2013.01)

(58) Field of Classification Search
CPC .... H03K 17/693; H03K 17/005; H03K 17/74; H03K 17/6257; H04J 3/047
USPC .......................................... 327/407, 408, 530
See application file for complete search history.

(56) References Cited

U.S. PATENT DOCUMENTS

| | | | |
|---|---|---|---|
| 6,281,724 B1 | 8/2001 | Ellis | |
| 7,537,970 B2 * | 5/2009 | Robb | H01L 21/823487 257/E29.215 |
| 7,638,903 B2 | 12/2009 | Pelley, III et al. | |
| 7,893,566 B2 * | 2/2011 | Yarbrough | H03K 3/356 307/115 |
| 9,443,845 B1 * | 9/2016 | Stafanov | H01L 29/407 |
| 9,768,773 B2 | 9/2017 | Englekirk | |
| 9,929,730 B2 * | 3/2018 | Spiel | H03K 17/687 |
| 2006/0214722 A1 * | 9/2006 | Hirose | H03K 17/162 327/407 |
| 2016/0077562 A1 * | 3/2016 | Smith | G06F 1/266 713/310 |
| 2016/0164516 A1 * | 6/2016 | Spiel | H03K 17/687 307/140 |

* cited by examiner

*Primary Examiner* — Anh Q Tra

(57) ABSTRACT

One example discloses a voltage select circuit, comprising: a first input configured to receive a first input voltage; a second input configured to receive a second input voltage; a first diode having a first polarity coupled to the first input; a second diode having a first polarity coupled to the second input; an output coupled to a second polarity of both the first and second diodes; a diode bypass circuit coupled to the first input and the output in parallel with the first diode, and coupled to the second input; and wherein the bypass circuit is configured to pass the first input voltage to the output if an absolute value of the second input voltage is less than a voltage drop of the second diode.

16 Claims, 4 Drawing Sheets

VOLTAGE SELECT CIRCUIT

The present specification relates to systems, methods, apparatuses, devices, circuits, articles of manufacture and instructions for selecting a voltage source.

SUMMARY

According to an example embodiment, a voltage select circuit, comprising: a first input configured to receive a first input voltage; a second input configured to receive a second input voltage; a first diode having a first polarity coupled to the first input; a second diode having a first polarity coupled to the second input; an output coupled to a second polarity of both the first and second diodes; a diode bypass circuit coupled to the first input and the output in parallel with the first diode, and coupled to the second input; and wherein the bypass circuit is configured to pass the first input voltage to the output if an absolute value of the second input voltage is less than a voltage drop of the second diode.

In another example embodiment, the first polarity is a positive polarity; the second polarity is a negative polarity; and a more positive of the first and second input voltages is coupled to the output.

In another example embodiment, the first polarity is a negative polarity; the second polarity is a positive polarity; and a more negative of the first and second input voltages is coupled to the output.

In another example embodiment, a maximum absolute value of a magnitude of the first input voltage is less than the absolute value of a magnitude of the second voltage.

In another example embodiment, a maximum value of the first input voltage is less than a maximum value of the second voltage.

In another example embodiment, a minimum value of the first input voltage is greater than a minimum value of the second voltage.

In another example embodiment, the bypass circuit includes a MOS device having a drain, source and gate; the gate of the MOS device is coupled to the second input; the drain is coupled to the first input; and the source is coupled to the output.

In another example embodiment, the MOS device is a PMOS device configured to pass the first input voltage to the output if a voltage at the gate is less than or equal to zero volts.

In another example embodiment, the MOS device is a PMOS device configured to pass the first input voltage to the output if the second input voltage is less than or equal to zero volts.

In another example embodiment, the MOS device is an enhancement mode MOS device.

In another example embodiment, the MOS device is an extended-drain MOS device.

In another example embodiment, further comprising a third diode coupled between the diode bypass circuit and the second input.

In another example embodiment, further comprising a third diode coupled between the gate and the second input; wherein the third diode is configured to limit a voltage at the gate from the second input voltage on the second input.

In another example embodiment, further comprising a resistor coupled between the gate and a reference potential; wherein the resistor is configured to clamp a voltage at the gate to less than a MOS device breakdown voltage.

In another example embodiment, further comprising a third diode coupled between the diode bypass circuit and a threshold control voltage; wherein the threshold control voltage is configured to set a constant voltage; and wherein the bypass circuit is configured to pass the first input voltage to the output if the absolute value of the second input voltage is less than the voltage drop of the second diode minus the constant voltage.

In another example embodiment, the bypass circuit includes a PMOS device having a drain, source and gate; the gate of the PMOS device is coupled to the second input; the drain is coupled to the first input; the source is coupled to the output; and the constant voltage less than or equal to a threshold voltage of the PMOS device.

According to an example embodiment, a voltage select circuit in a USB signaling system, comprising: a first input configured to receive a first input voltage; a second input configured to receive a second input voltage; a first diode having a first polarity coupled to the first input; a second diode having a first polarity coupled to the second input; an output coupled to a second polarity of both the first and second diodes; a diode bypass circuit coupled to the first input and the output in parallel with the first diode, and coupled to the second input; wherein the bypass circuit is configured to pass the first input voltage to the output if an absolute value of the second input voltage is less than a voltage drop of the second diode; and wherein the output is coupled to a current generation circuit configured to output a gate bias for the USB signaling system.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

Figure 1:
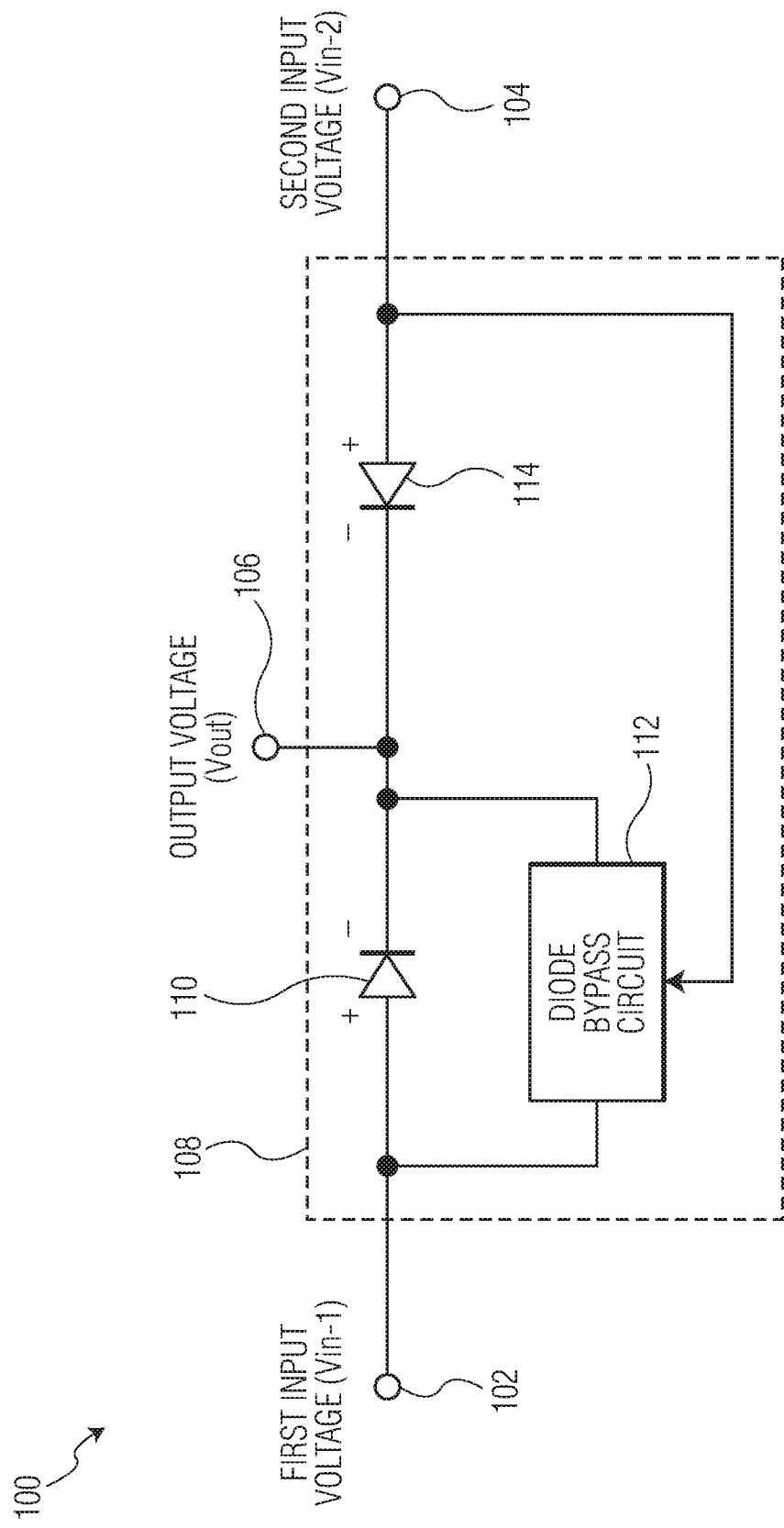
FIG. 1 is a first example embodiment of a voltage select circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Predictable and resilient voltage generation and/or selection is applicable to a variety of domains, such as data communication signal levels, where data signal level decoding requires low insertion loss and high bandwidth. For example, in USB signaling applications, a charge pump voltage level is a critical parametric data for efficient signal sampling.

In example applications where multiple voltage sources or charge pumps voltages are available, circuits may be designed to select the higher voltage level so that various other circuit, device, and/or system level power management constraints may be relaxed and with reference to the example above, can improve USB signaling reliability.

Example approaches to selecting the higher voltage level may include: using a charge pump cascaded with a regulator, a comparator selecting between two inputs and scaled down using resistor divider, or an op-amp based topology configured in a feedback system.

However, such example approaches may lack dynamic voltage selection, have reliability concerns, load the input voltage sources, increase power consumption on the power supply rails, and/or have stability compensation problems.

Now discussed is a voltage select circuit which selects the higher of two input voltage signals to pass on to a voltage output. Such output voltage can then be used in various applications, such as USB signaling, discussed above.

The example voltage select circuit prevents various over-voltage stress scenarios and guides the higher voltage signal to the output with reduced reliability concerns. Various example embodiments of the voltage select circuit include protection against internal voltage select circuit breakdowns and may include example embodiments that clamp certain internal circuit voltages to a safer level. This voltage select circuit enables higher input voltage selection in transparent manner irrespective of the input voltages' DC levels, thereby providing a greater flexibility in power management applications.

FIG. 1 is a first example 100 embodiment of a voltage select circuit 108. The example 100 embodiment shows a first input 102 for receiving a first positive input voltage (Vin-1), a second input 104 for receiving a second positive input voltage (Vin-2), an output 106 for presenting the selected output voltage (Vout), and the voltage select circuit 108.

The voltage select circuit 108 includes a first diode 110 having a first polarity (+) and a second polarity (−), a diode bypass circuit 112, and a second diode 114 having a first polarity (+) and a second polarity (−).

The first diode 110 first polarity (+) is coupled to the first input 102. The second diode 114 first polarity (+) is coupled to the second input 104. The output 106 is coupled to the second polarity (−) of both the first and second diodes 110, 114. This could be labeled as a "face-off" topology.

The diode bypass circuit 112 is coupled to the first input 102 and the output 106 in parallel with the first diode 110, and is also coupled to the second input 104. The bypass circuit 112 is configured to pass the first input voltage to the output 106 if the second input voltage is less than a voltage drop (e.g. 0.6V) of the second diode 114. Thus the more positive of the first and second input voltages is coupled to the output 106.

In some example embodiments it is known a priori that a maximum value of one voltage (e.g. Vin-1) is less than a maximum value of the other voltage (e.g. Vin-2). In such examples, the lesser of the two voltages is coupled to the first input 102 so as to benefit from the diode bypass circuit 112.

Figure 2:
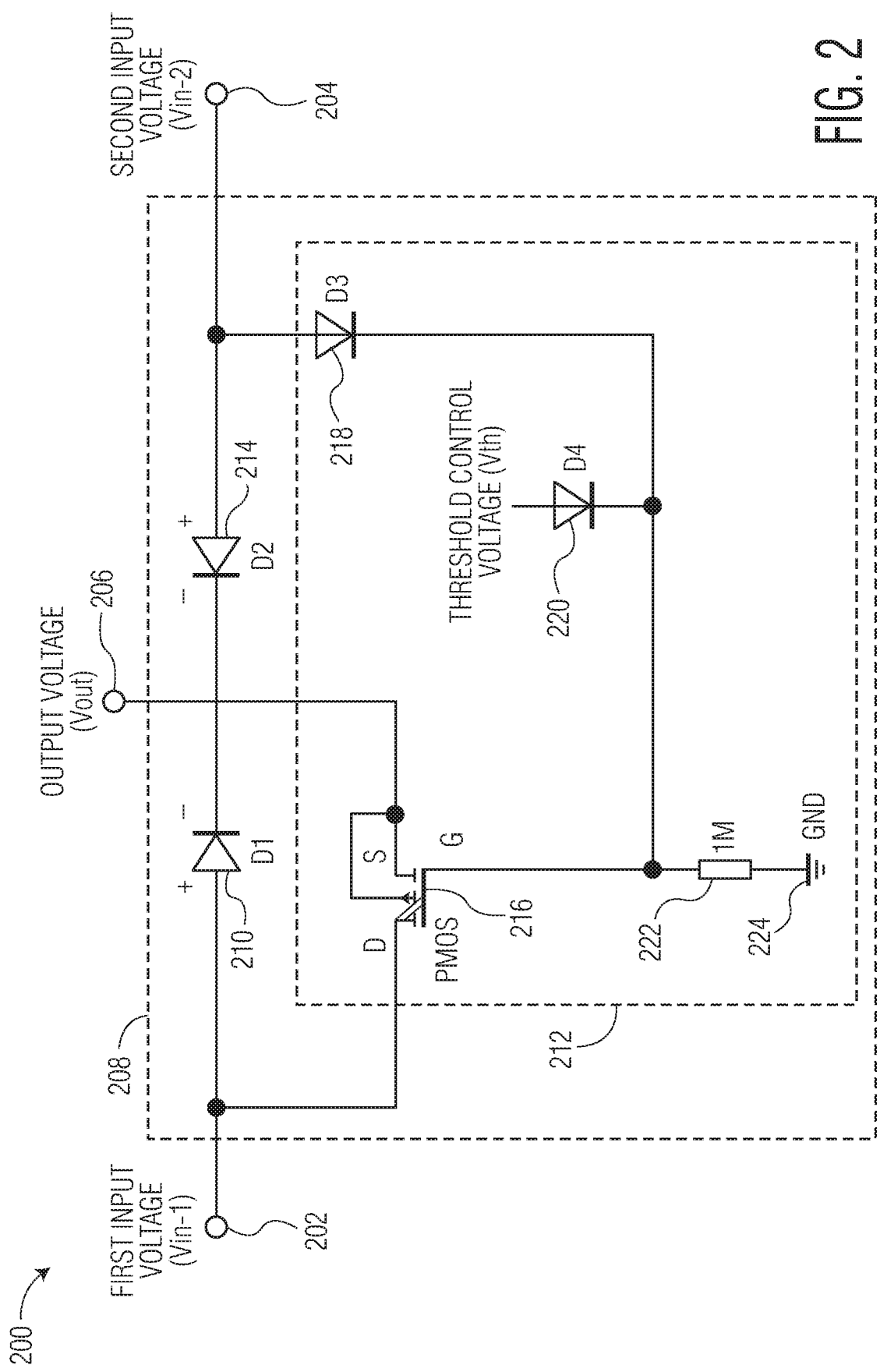
FIG. 2 is a second example embodiment of the voltage select circuit.

FIG. 2 is a second example 200 embodiment of a voltage select circuit 208. The example 200 embodiment shows a first input 202 for receiving a first voltage (Vin-1), a second input 204 for receiving a second voltage (Vin-2), an output 206 for presenting an output voltage (Vout), and the voltage select circuit 208.

The voltage select circuit 208 includes a first diode 210 having a first polarity (+) and a second polarity (−), a diode bypass circuit 212, and a second diode 214 having a first polarity (+) and a second polarity (−).

The diode bypass circuit 212 includes a MOS (e.g. PMOS) device 216, a third diode 218 for receiving the second voltage (Vin-2), a fourth diode 220 for receiving a threshold control voltage (Vth), a resistor 222, and a ground 224.

The MOS device 216 includes a drain, source and gate. The gate is coupled to the second input 204, the drain is coupled to the first input 202, and the source is coupled to the output 206. The PMOS device 216 passes the first input voltage to the output 206 if a voltage at the gate is less than or equal to zero volts.

Thus, for example, if the second input voltage (Vin-2) is less than or equal to zero volts (e.g. is absent), then the PMOS device 216 passes the first input voltage (Vin-1) to the output 206. In some example embodiments, the MOS device 216 is an enhancement mode or an extended-drain MOS device.

The third diode 218 is coupled between the gate of the PMOS device 216 and the second input 204. The third diode is configured to limit a voltage at the gate from the second input voltage (Vin-2) on the second input 204.

The third diode 218 (D3) also blocks any back current to Vin-1 when Vin-2 is present. In this case, source and gate of the PMOS device 216 are both at a diode drop below Vin-2. The PMOS device 216 is turned off. The back-to-back connected diodes D1 and D2 also prevent back currents from either Vin-1 to Vin-2 or Vin-2 to Vin-1.

The resistor 222 is coupled between the gate of the PMOS device 216 and a reference potential, such as the ground 224. The resistor 222 is configured to clamp a voltage at the gate to less than the PMOS device 216 breakdown voltage.

The fourth diode 220 is coupled between the gate of the PMOS device 216 and a threshold control voltage (Vth). The threshold control voltage is configured to a constant, relatively stable, DC-bias voltage and thus sets a threshold turn-on gate voltage for the PMOS device 216. In one example embodiment, the PMOS device 216 passes the first input voltage (Vin-1) to the output 206 if the value of the second input voltage (Vin-2) is less than the voltage drop of the second diode 214 minus the constant set by Vth. In other example embodiments D4 is biased with a constant voltage less than Vin-1 and Vin-2.

In various example embodiments a criteria for the threshold control voltage (Vth) pin connection to D4 is that it should be low enough to turn on the PMOS device 216 and maintain a low RON when (Vin-1) is the only available power supply; however, it should be high enough to make sure the source/drain to gate voltage is within the PMOS device 216 tolerances. The fourth diode 220 (D4) also acts a reverse current protection and prevents charging of the threshold control voltage (Vth) supply.

Example operational values for the voltage select circuit 208 are now provided. The voltage select circuit 208 differentiates the two voltage signals (Vin-1) and (Vin-2), and selects the higher of the two. If Vin-1 is higher than Vin-2 by more than the first diode 210 (D1) 0.6V diode-drop, then Vin-1 will effectively reverse bias the second diode 214 (D2) thereby blocking Vin-2. The opposite is true as well if Vin-2 is more than the second diode 214 (D2) 0.6V diode-drop, then Vin-2 will effectively reverse bias the first diode 210 (D1) thereby blocking Vin-1.

The voltage (Vout) on the output 206 will be one diode drop (i.e. from D2) down from the Vin-2 side and nearly zero drop from Vin-1 side due to the diode bypass circuit 212, since the PMOS device 216 connected across the first diode 210 (D1) overcomes D1's voltage drop and allows smaller values of Vin-1 to pass through to the output 206.

The enhancement mode PMOS device 216 "turns on" if Vgs is negative. Thus while when Vin-2>0.6V then Vgs=0 V, and the PMOS is "off", if Vin-2<0.6V then Vgs=0V−Vout=negative V, and the PMOS 216 will be "on" and thus pass Vin-1 as Vout.

To reiterate, in those example embodiments, where either the first voltage (Vin-1) or the second voltage (Vin-2) is known to have a lower minimum voltage, coupling the lower minimum voltage supply to the first input 102 enables the lower minimum voltage supply to benefit from the diode bypass circuit's 112 lower pass through voltage. Unlike just a stand-alone two diode voltage selection circuit (i.e. without the diode bypass circuit 212), the addition of the PMOS device 216 improves the minimum supply voltage by a diode voltage drop (i.e. permits an input voltage lower than a 0.6 V diode drop to pass as Vout).

Figure 3:
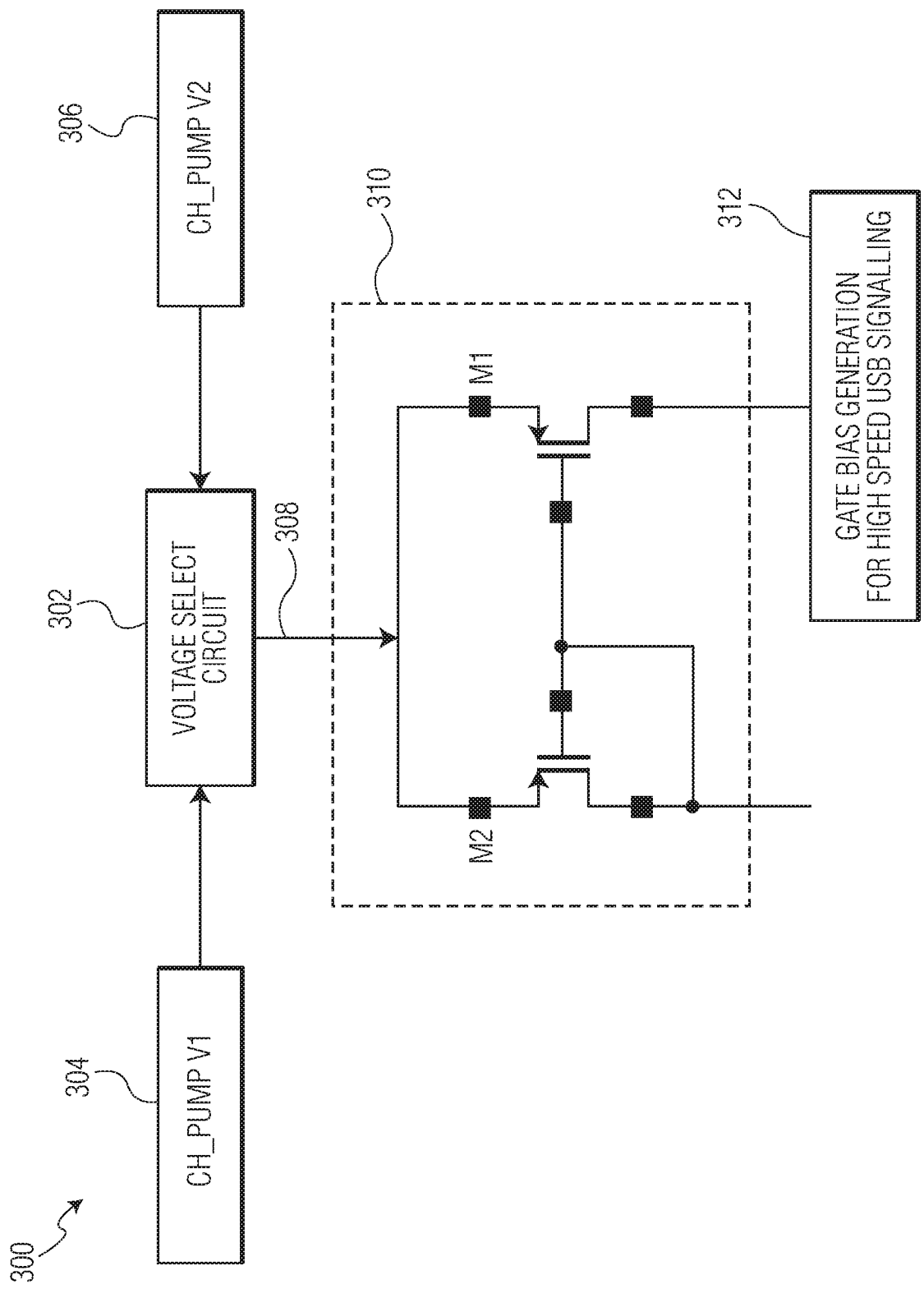
FIG. 3 is an example embedded embodiment of the voltage select circuit.

FIG. 3 is an example 300 embedded embodiment of the voltage select circuit. The example 300 includes a voltage select circuit 302, a first charge pump 304 (i.e. for providing Vin-1), a second charge pump 306 (i.e. for providing Vin-2), an analog voltage rail 308 for providing the output voltage (Vout), an application circuit 310 (e.g. a current generation circuit), and an example gate bias generation for high-speed USB signaling output 312.

The voltage select circuit 302 receives the two input charge pump voltages, and selects/passes-through to the analog voltage rail 308 the higher one.

Figure 4:
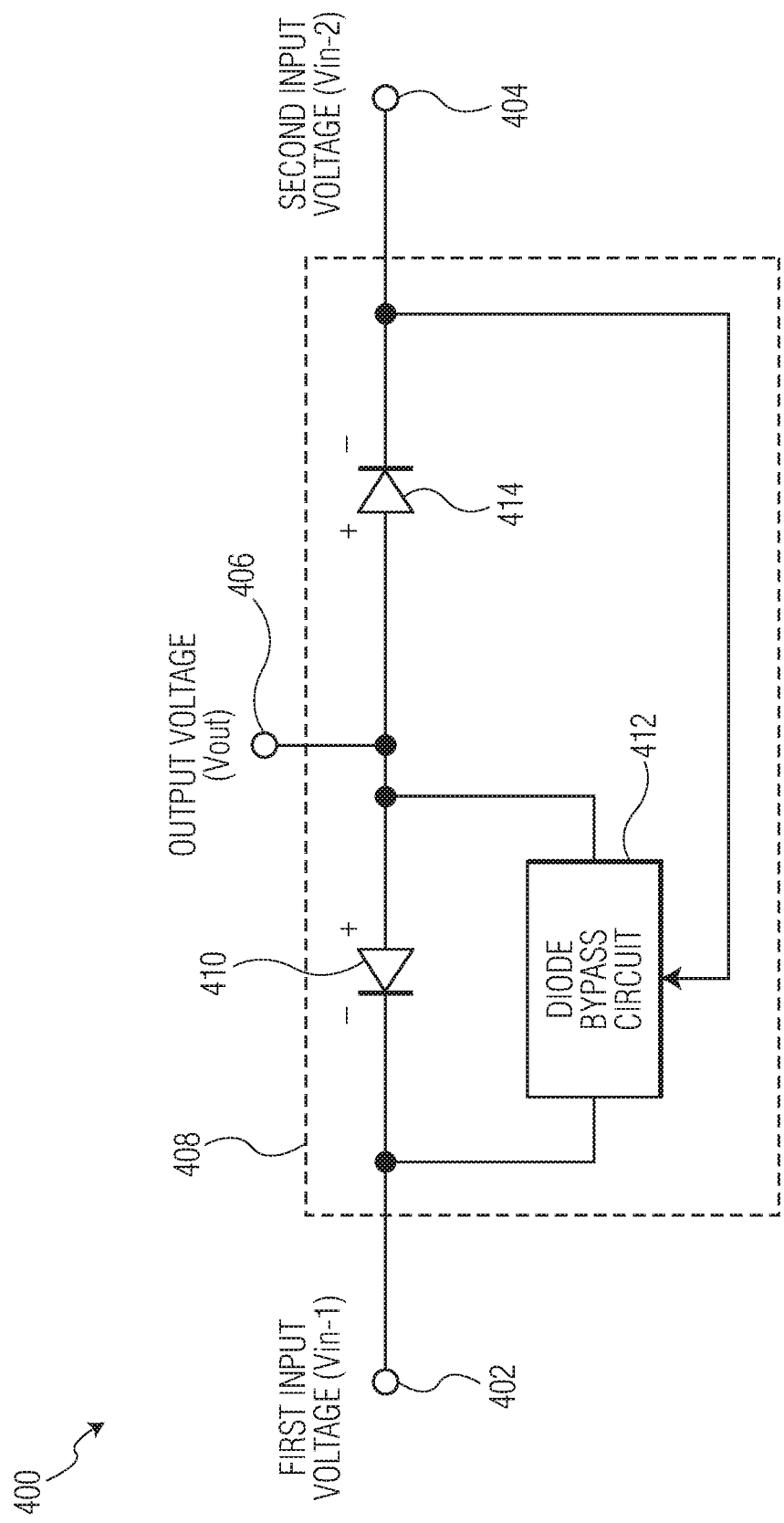
FIG. 4 is a third example embodiment of the voltage select circuit.

FIG. 4 is a third example 400 embodiment of a voltage select circuit 408. The example 400 embodiment shows a first input 402 for receiving a first negative input voltage (Vin-1), a second input 404 for receiving a second negative input voltage (Vin-2), an output 406 for presenting the selected output voltage (Vout), and the voltage select circuit 408. This example embodiment requires generation of negative high voltage references.

The voltage select circuit 408 includes a first diode 410 having a first polarity (+) and a second polarity (−), a diode bypass circuit 412, and a second diode 414 having a first polarity (+) and a second polarity (−).

The first diode 410 first polarity (−) is coupled to the first input 402. The second diode 414 first polarity (−) is coupled to the second input 404. The output 406 is coupled to the second polarity (+) of both the first and second diodes 410, 414.

The diode bypass circuit 412 is coupled to the first input 402 and the output 406 in parallel with the first diode 410, and is also coupled to the second input 404. The bypass circuit 412 is configured to pass the first input voltage to the output 406 if the second input voltage is less than a voltage drop (e.g. 0.6V) of the second diode 414. Thus the more negative of the first and second input voltages is coupled to the output 406.

In some example embodiments it is known a priori that a minimum negative value of one voltage (e.g. Vin-1) is greater than a minimum negative value of the other voltage (e.g. Vin-2). In such examples, the greater of the two negative voltages is coupled to the first input 402 so as to benefit from the diode bypass circuit 412.

In some example embodiments the diode bypass circuit 412 includes an NMOS device configured to pass the first input voltage to the output if a voltage at the gate of the NMOS device is a voltage other than zero volts.

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and, are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transient computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. Voltage select circuit, comprising:
    a first input configured to receive a first input voltage;
    a second input configured to receive a second input voltage;
    a first diode having a first polarity coupled to the first input;
    a second diode having a first polarity coupled to the second input;
    an output coupled to a second polarity of both the first and second diodes;
    a diode bypass circuit coupled to the first input and the output in parallel with the first diode, and coupled to the second input;
    wherein the bypass circuit is configured to pass the first input voltage to the output if an absolute value of the second input voltage is less than a voltage drop of the second diode;
    a third diode coupled between the diode bypass circuit and a threshold control voltage;
    wherein the threshold control voltage is configured to set a constant voltage; and
    wherein the bypass circuit is configured to pass the first input voltage to the output if the absolute value of the second input voltage is less than the voltage drop of the second diode minus the constant voltage.

2. The device of claim 1:
    wherein the first polarity is a positive polarity;
    wherein the second polarity is a negative polarity; and
    wherein a more positive of the first and second input voltages is coupled to the output.

3. The device of claim 1:
    wherein the first polarity is a negative polarity;
    wherein the second polarity is a positive polarity; and
    wherein a more negative of the first and second input voltages is coupled to the output.

4. The device of claim 1:
    wherein a maximum absolute value of a magnitude of the first input voltage is less than the absolute value of a magnitude of the second voltage.

5. The device of claim 1:
    wherein a maximum value of the first input voltage is less than a maximum value of the second voltage.

6. The device of claim 1:
    wherein a minimum value of the first input voltage is greater than a minimum value of the second voltage.

7. The device of claim 1:
    wherein the bypass circuit includes a MOS device having a drain, source and gate;
    wherein the gate of the MOS device is coupled to the second input;
    wherein the drain is coupled to the first input; and
    wherein the source is coupled to the output.

8. The device of claim 7:
    wherein the MOS device is a PMOS device configured to pass the first input voltage to the output if a voltage at the gate is less than or equal to zero volts.

9. The device of claim 7:
    wherein the MOS device is a PMOS device configured to pass the first input voltage to the output if the second input voltage is less than or equal to zero volts.

10. The device of claim 7:
    wherein the MOS device is an enhancement mode MOS device.

11. The device of claim 1:
    wherein the MOS device is an extended-drain MOS device.

12. The device of claim 7:
    wherein the third diode is coupled between the gate and the second input;
    wherein the third diode is configured to limit a voltage at the gate from the second input voltage on the second input.

13. The device of claim 7:
    further comprising a resistor coupled between the gate and a reference potential;
    wherein the resistor is configured to clamp a voltage at the gate to less than a MOS device breakdown voltage.

14. The device of claim 1:
    wherein the bypass circuit includes a PMOS device having a drain, source and gate;
    wherein the gate of the PMOS device is coupled to the second input;
    wherein the drain is coupled to the first input;
    wherein the source is coupled to the output; and
    wherein the constant voltage less than or equal to a threshold voltage of the PMOS device.

15. The device of claim 1:
    wherein the third diode is coupled between the diode bypass circuit and the second input.

16. Voltage select circuit in a USB signaling system, comprising:
    a first input configured to receive a first input voltage;
    a second input configured to receive a second input voltage;
    a first diode having a first polarity coupled to the first input;
    a second diode having a first polarity coupled to the second input;
    an output coupled to a second polarity of both the first and second diodes;
    a diode bypass circuit coupled to the first input and the output in parallel with the first diode, and coupled to the second input;
    wherein the bypass circuit is configured to pass the first input voltage to the output if an absolute value of the second input voltage is less than a voltage drop of the second diode;
    a third diode coupled between the diode bypass circuit and a threshold control voltage;
    wherein the threshold control voltage is configured to set a constant voltage;
    wherein the bypass circuit is configured to pass the first input voltage to the output if the absolute value of the second input voltage is less than the voltage drop of the second diode minus the constant voltage; and
    wherein the output is coupled to a current generation circuit configured to output a gate bias for the USB signaling system.

* * * * *